US012772620B2

(12) United States Patent
Tsai et al.

(10) Patent No.: US 12,772,620 B2
(45) Date of Patent: *Oct. 20, 2026

(54) LIGHT EMITTING DIODE

(71) Applicant: Taiwan-Asia Semiconductor Corporation, Hsinchu City (TW)

(72) Inventors: Ching-Yuan Tsai, Hsinchu City (TW); Yao-Hong Huang, Hsinchu City (TW); Hong-Ta Cheng, Hsinchu City (TW)

(73) Assignee: Taiwan-Asia Semiconductor Corporation, Hsinchu City (TW)

( * ) Notice: Subject to any disclaimer, the term of this patent is extended or adjusted under 35 U.S.C. 154(b) by 374 days.

This patent is subject to a terminal disclaimer.

(21) Appl. No.: 18/528,009

(22) Filed: Dec. 4, 2023

(65) Prior Publication Data

US 2025/0072172 A1 Feb. 27, 2025

(30) Foreign Application Priority Data

Aug. 23, 2023 (TW) ................................ 112131773

(51) Int. Cl.

| | |
|---|---|
| ***H10H 20/00*** | (2025.01) |
| ***H10H 20/824*** | (2025.01) |
| ***H10H 20/831*** | (2025.01) |
| *H10H 20/82* | (2025.01) |

(52) U.S. Cl.

CPC .... *H10H 20/8316* (2025.01); *H10H 20/8242* (2025.01); *H10H 20/82* (2025.01)

(58) Field of Classification Search

CPC ............. H10H 20/8316; H10H 20/824; H10H 20/8242; H10H 20/82

See application file for complete search history.

(56) References Cited

U.S. PATENT DOCUMENTS

| | | | | |
|---|---|---|---|---|
| 2014/0077221 | A1 * | 3/2014 | Genei | H10H 20/824 257/94 |
| 2015/0255680 | A1 | 9/2015 | Matsumura et al. | |
| 2016/0276534 | A1 * | 9/2016 | Sundgren | H10F 77/1243 |
| 2022/0077370 | A1 | 3/2022 | Zhang et al. | |
| 2025/0072169 | A1 * | 2/2025 | Tsai | H10H 20/841 |

FOREIGN PATENT DOCUMENTS

| | | | |
|---|---|---|---|
| CN | 111490136 | B | 6/2018 |
| EP | 3905344 | A1 | 11/2021 |
| JP | 2019040928 | A | 3/2019 |
| TW | 200633247 | A | 9/2006 |
| TW | 201036206 | A | 10/2010 |
| TW | 202044610 | A | 12/2020 |

* cited by examiner

*Primary Examiner* — Reema Patel

(74) *Attorney, Agent, or Firm* — MUNCY, GEISSLER, OLDS & LOWE, P.C.

(57) ABSTRACT

The present invention relates to a light-emitting diode (LED) which comprises multiple point-like transparent conductive electrodes, a dielectric layer, and an epitaxial composite layer. The dielectric layer is disposed around each point-like transparent conductive electrode. The epitaxial composite layer comprises a carbon-doped gallium arsenide epitaxial layer. The carbon-doped gallium arsenide epitaxial layer is disposed both on each point-like transparent conductive electrode and the dielectric layer and electrically connected to each point-like transparent conductive electrode.

11 Claims, 5 Drawing Sheets

LIGHT EMITTING DIODE

CROSS-REFERENCES TO RELATED APPLICATIONS

This application claims the benefit of priority to Taiwanese Patent Application No. 112131773 filed on Aug. 23, 2023, which is hereby incorporated by reference in its entirety.

BACKGROUND OF THE INVENTION

Field of the Invention

The present invention relates to a light-emitting diode, in particular to a light-emitting diode with high brightness.

Descriptions of the Related Art

Light Emitting Diode (hereinafter referred to as LED) has the advantages of high brightness, small size, low power consumption and long life, and is widely used in lighting or display products. In conventional short-wave infrared light-emitting diodes (SWIR LEDs), in pursuit of the goals of developing different size specifications and improving brightness, conventional technologies usually use P-type ohmic-contact metal and specular reflection system in the light-emitting diode structure. Different structural tests will be performed to improve light reflection and extraction efficiency. Specifically, please refer to FIG. 1, which shows a currently common quaternary infrared light-emitting diode 1 in the 850~1100 nanometer (nm) band. The structure of this type of light-emitting diode 1 has a transition layer 10, a P-type semiconductor layer 20 of magnesium (Mg) doped gallium phosphide (GaP), and a P-type semiconductor layer 30 of carbon (C) doped gallium phosphide (GaP). This type of light-emitting diode 1 uses the transition layer 10 to adjust the lattice mismatch between the magnesium-doped gallium phosphide epitaxial layer 20 and the upper aluminum indium phosphide epitaxial layer 40. Moreover, magnesium-doped gallium phosphide epitaxial layer 20 serves as a current spreading layer to achieve the effect of current spreading and enhance the brightness. The carbon-doped gallium phosphide epitaxial layer 30 serves as a P-type ohmic-contact layer to electrically connect the lower metal electrode 50. However, the entire structure of the carbon-doped gallium phosphide epitaxial layer 30 has a light absorption effect, which affects the brightness.

In order to overcome the above problems, the industry urgently needs an innovative light-emitting diode structure and its manufacturing process to increase brightness while improving the problems of complex manufacturing process, high cost, and high forward voltage.

SUMMARY OF THE INVENTION

One main objective of the present invention is to provide a high-brightness light-emitting diode with simplified process steps and reduced costs. Through the new mirror structure of the light-emitting diode of the invention, the light extraction efficiency is improved and the problems of low brightness, complex manufacturing process, high cost and excessive forward voltage of the traditional light-emitting diode structure are solved.

To achieve the above objective, the present invention provides a light-emitting diode which comprises multiple point-like transparent conductive electrodes, a dielectric layer, and an epitaxial composite layer. The dielectric layer is disposed around each point-like transparent conductive electrode. The epitaxial composite layer has a carbon-doped gallium arsenide epitaxial layer, disposed both on each of the point-like transparent conductive electrodes and the dielectric layer, and electrically connected to each of the point-like transparent conductive electrodes.

In one embodiment of the light-emitting diode of the present invention, the materials of the point-like transparent conductive electrodes comprise indium tin oxide.

In one embodiment of the light-emitting diode of the present invention, the ratio of the total distribution area of the point-like transparent conductive electrodes to the area of the epitaxial composite layer is about 3.5% to 8%.

In one embodiment of the light-emitting diode of the present invention, the thickness of the carbon-doped gallium arsenide epitaxial layer is about 100~1000 angstroms (Å).

In one embodiment of the light-emitting diode of the present invention, the carbon-doping concentration of the carbon-doped gallium arsenide epitaxial layer is about 4.0*E19~1.5*E20.

In one embodiment of the light-emitting diode of the present invention, the epitaxial composite layer further comprises a first semiconductor layer, a light-emitting layer, a second semiconductor layer and a third semiconductor layer, wherein the third semiconductor layer is disposed on the carbon-doped gallium arsenide epitaxial layer, the second semiconductor layer is disposed on the third semiconductor, the light-emitting layer is disposed on the second semiconductor layer, and the first semiconductor layer is disposed on the light-emitting layer.

In one embodiment of the light-emitting diode of the present invention, the first semiconductor layer is an N-type aluminum gallium arsenide (AlGaAs) epitaxial layer, and the second semiconductor layer is a P-type aluminum gallium arsenide (AlGaAs) epitaxial layer, and the third semiconductor layer is a P-type aluminum indium phosphide (AlInP) epitaxial layer.

In one embodiment of the light-emitting diode of the present invention, the light-emitting diode further comprises a first transparent conductive layer, a second transparent conductive layer and a metal layer, wherein the first transparent conductive layer is disposed on the second transparent conductive layer and electrically connected to the point-like transparent conductive electrodes, and the second transparent conductive layer is disposed on the metal layer.

In one embodiment of the light-emitting diode of the present invention, the materials of the first transparent conductive layer comprise indium tin oxide.

In one embodiment of the light-emitting diode of the present invention, the second transparent conductive layer is made of indium tin oxide, zinc aluminum oxide, zinc tin oxide, nickel oxide, cadmium tin oxide, antimony tin oxide and the combination thereof.

In one embodiment of the light-emitting diode of the present invention, the light-emitting diode further comprises an upper electrode disposed on the epitaxial composite layer which does not vertically overlap with the point-like transparent conductive electrodes.

After reviewing the diagrams and subsequent descriptions, those skilled in the art will readily understand other objectives of the present invention, as well as the technical means and embodiments of the present invention.

DETAILED DESCRIPTION OF THE PREFERRED EMBODIMENT

The content of the present invention will be explained through examples below. The examples of the present invention are not intended to limit the implementation of the present invention to any specific environment, application, or particular manner as described in the examples. Therefore, the description of the examples is only to elucidate the purpose of the present invention, and not to limit the present invention. It should be noted that in the following examples and figures, components not directly related to the present invention have been omitted and not shown. The dimensional relationships between the components in the figures are provided for ease of understanding and are not intended to limit the actual proportions.

Figure 2:
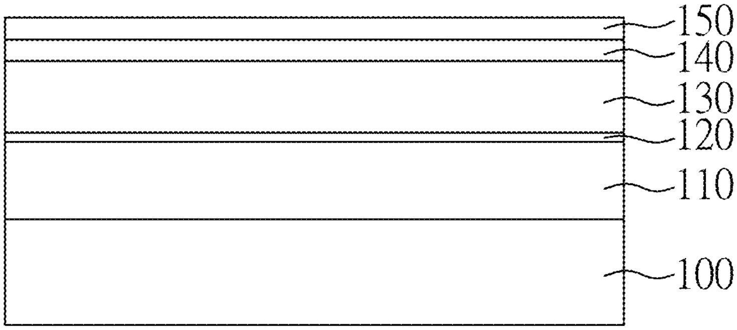
FIG. 2 to FIG. 9 are process flow diagrams of a light-emitting diode in one embodiment of the present invention.

Please refer to FIG. 2, which discloses one embodiment of the present invention for producing a light-emitting diode, particularly a short-wave infrared light-emitting diode. Specifically, gallium arsenide (GaAs) is used, for example, as an epitaxial growth substrate 100. Subsequently, an epitaxial composite layer is formed on the GaAs substrate, and this composite layer can be a double heterostructure of aluminum gallium arsenide (AlGaAs). Specifically, in this embodiment, the double heterostructure includes a first semiconductor layer 110, a light-emitting layer 120 formed on the first semiconductor layer 110, a second semiconductor layer 130 formed on the light-emitting layer 120, and a third semiconductor layer 140 formed on the second semiconductor layer 130. The light-emitting layer 120 is formed as a multiple quantum well (MQW) structure, and in this embodiment, the emission wavelength range of the multiple quantum wells can be 1000~1200 nanometers (nm). The first semiconductor layer 110 is an N-type epitaxial layer of aluminum gallium arsenide (AlGaAs), the second semiconductor layer 130 is a P-type epitaxial layer of aluminum gallium arsenide (AlGaAs), and the third semiconductor layer 140 is a P-type epitaxial layer of aluminum indium phosphide (AlInP). It should be noted that the materials mentioned in this embodiment are just examples, and the present invention is not limited thereto. In practical applications, the materials and their compositions can be adjusted according to the emission wavelength, for example, epitaxial layers can be composed of aluminum gallium indium phosphide (AlGaInP), indium gallium phosphide (InGaP), aluminum gallium arsenide (AlGaAs), indium gallium arsenide (InGaAs), or indium phosphide (InP), among others.

Figure 1:
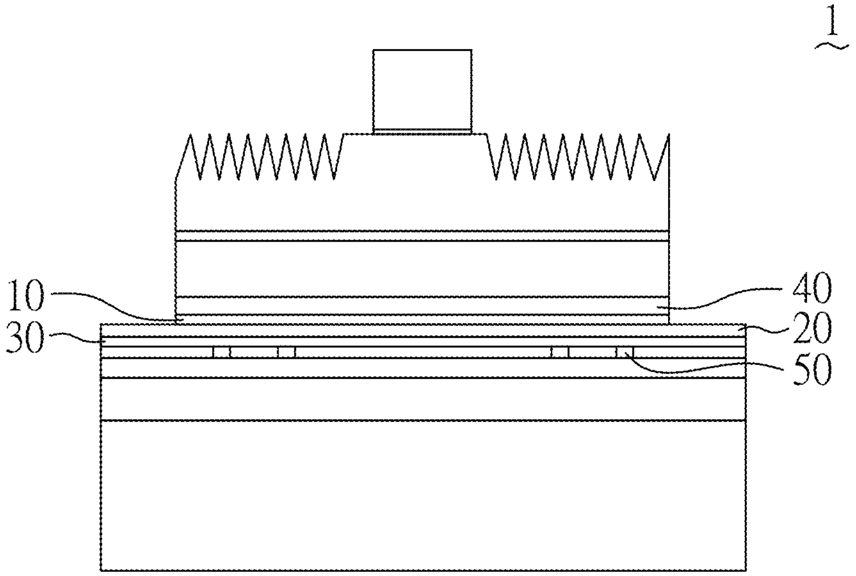
FIG. 1 is a schematic diagram of a conventional light-emitting diode structure.

Please continue to refer to FIG. 2. A P-type carbon (C)-doped gallium arsenide (GaAs) epitaxial layer 150 is epitaxially grown on the third semiconductor layer 140. It should be noted that there is no lattice mismatch issue between the carbon-doped gallium arsenide epitaxial layer 150 and the aluminum indium phosphide epitaxial layer 140. Therefore, the transition layer in the conventional structure as mentioned in the background can be omitted. Moreover, within the emission wavelength range of 1000~1200 nanometers (nm), the carbon-doped gallium arsenide epitaxial layer 150 does not exhibit the light absorption issue as known in the carbon-doped gallium phosphide epitaxial layers. Therefore, the light-emitting diode structure of the present invention can use this single-layer structure of carbon-doped gallium arsenide epitaxial layer 150 to directly replace the three-layer structure of the conventional light-emitting diode structure shown in FIG. 1, including the transition layer 10, magnesium (Mg)-doped gallium phosphide (GaP) epitaxial layer 20, and carbon (C)-doped gallium phosphide (GaP) epitaxial layer 30. This not only simplifies the structure of the light-emitting diode but also saves the traditional time-consuming epitaxial process, thereby reducing the process cost. In the preferred embodiment of the present invention, the thickness of the carbon-doped gallium arsenide epitaxial layer 150 is approximately 100~1000 angstroms (Å), and the carbon doping concentration in the carbon-doped gallium arsenide epitaxial layer 150 is approximately 4.0*E19~1.5*E20.

Figure 3:
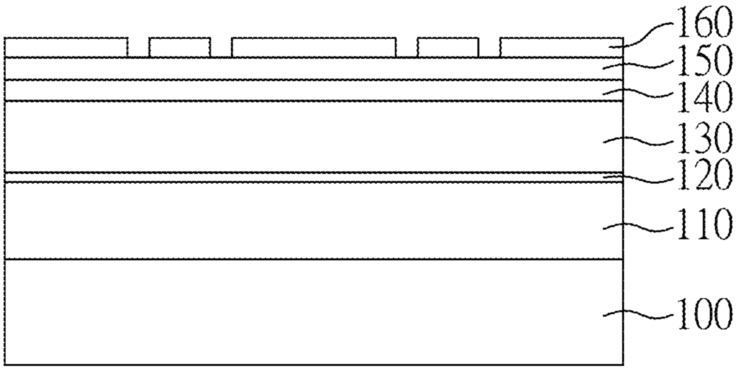
Figure 4:
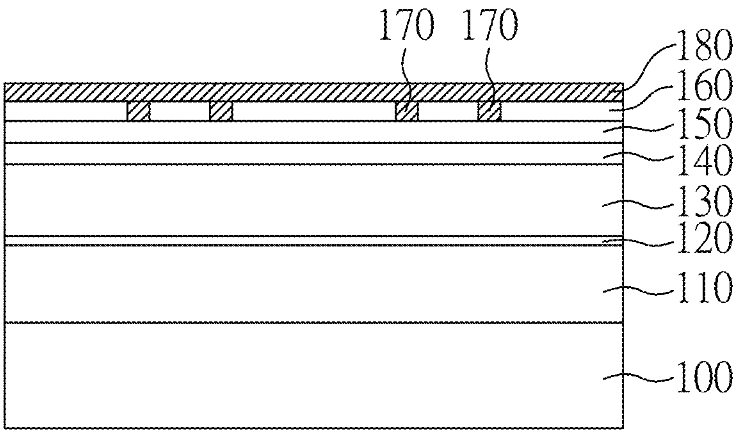

Please refer to FIG. 3. A dielectric layer 160 is deposited to cover the entire wafer surface. The dielectric layer 160 is, for example, a low refractive index dielectric layer, and the material of the dielectric layer 160 can be silicon dioxide ($SiO_2$), silicon nitride ($Si_3N_4$), etc. Subsequently, a photolithography process is used to remove a portion of the dielectric layer 160 until the surface of the carbon-doped gallium arsenide epitaxial layer 150 is exposed for defining the distribution positions and areas of the point-like lower electrodes formed next. Please refer to FIG. 4. A transparent conductive material is evaporated to cover the exposed carbon-doped gallium arsenide epitaxial layer 150 to form a plurality of point-like transparent conductive electrodes 170. After the formation of multiple point-like transparent conductive electrodes 170, the evaporation process continues to cover both the dielectric layer 160 and the multiple point-like transparent conductive electrodes 170 to form a first transparent conductive layer 180. The first transparent conductive layer 180 electrically connects with each of the point-like transparent conductive electrodes 170. In a specific embodiment, the aforementioned transparent conductive material comprises at least indium tin oxide (ITO).

Figure 5:
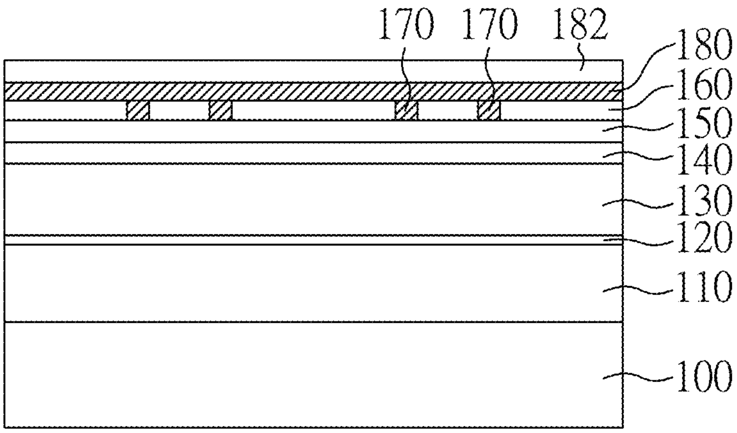

Please refer to FIG. 5. In a preferred embodiment, for the purpose of increasing adhesion, a second transparent conductive layer 182 is formed on the first transparent conductive layer 180 via an evaporation process and is electrically connected with the first transparent conductive layer 180. The material of the second transparent conductive layer 182 can be selected from a group consisting of indium tin oxide (ITO), aluminum zinc oxide (AZO), indium zinc oxide (IZO), nickel oxide, cadmium tin oxide, antimony tin oxide, and the combination thereof.

Figure 6:
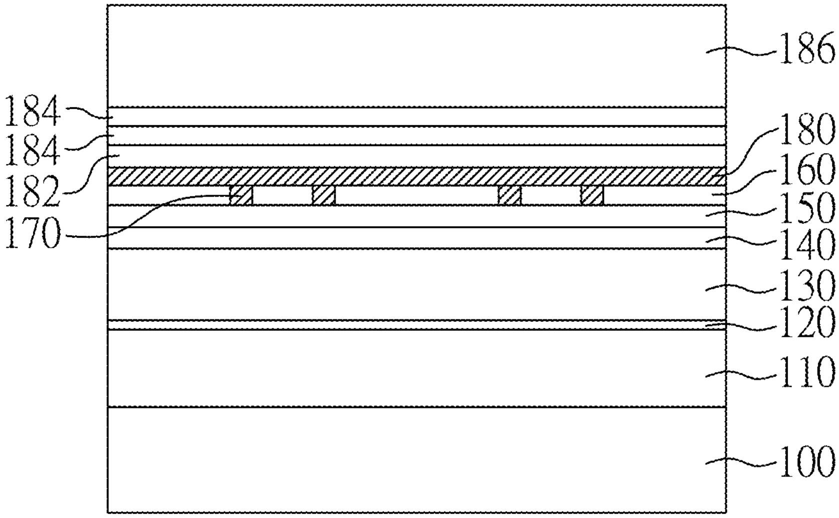

Please refer to FIG. 6. A bonding metal layer 184 is formed on the second transparent conductive layer 182 via an evaporation process. The bonding metal layer 184 is then bonded to a corresponding bonding metal layer 184 on another permanent bonding substrate 186. The transparent conductive layers 180, 182, and the bonding metal layer 182 can serve as a reflective mirror system for the light-emitting diode structure of the present invention, for reflecting the light emitted from the light-emitting layer upwards to increase light extraction efficiency thereof. The material of the aforementioned bonding metal layer 184 can be gold (Au) or indium gold (InAu) alloy. The permanent bonding substrate 186 can be, but not limited to, a silicon substrate or sapphire substrate.

Figure 7:
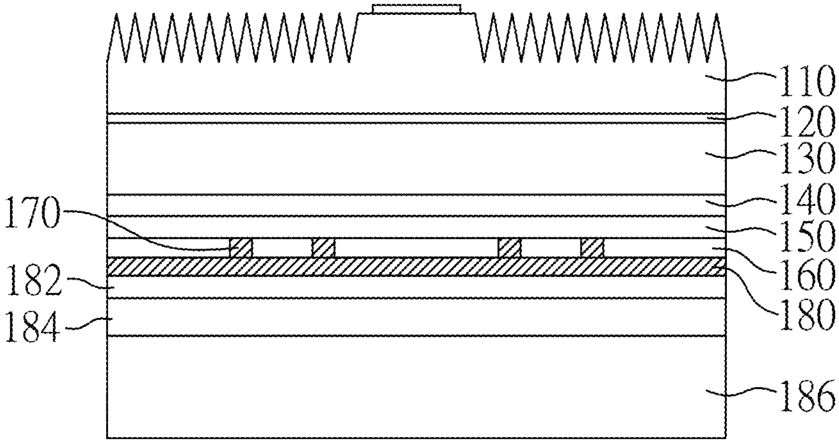
Figure 8:
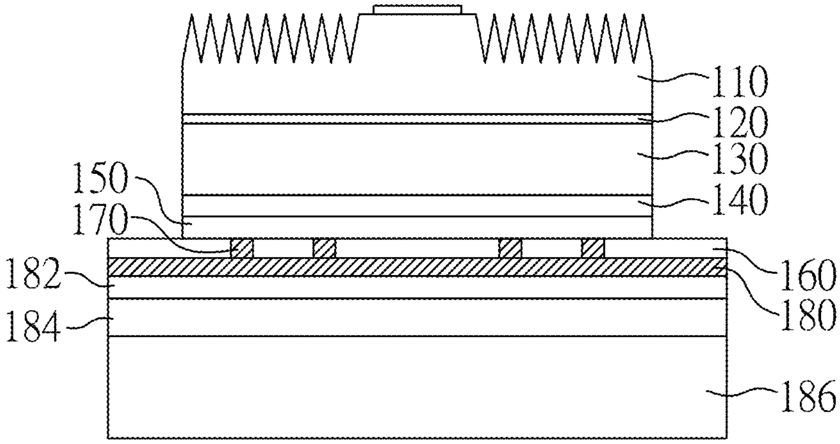

Please refer to FIG. 7. Remove the gallium arsenide epitaxial growth substrate 100 to expose the first semiconductor layer 110, and flip the permanent bonding substrate 186 so the permanent bonding substrate 186 will be disposed at the bottom of the light-emitting diode structure. Next, please continue to refer to FIG. 7. Define a planar region of the upper electrode which will be formed in the following on the N-type first semiconductor layer 110, and perform roughening treatment on the other areas of the N-type first semiconductor layer 110. Then, as shown in FIG. 8, a MESA process is performed to etch a portion of the epitaxial composite layer. Specifically, etch a portion of the N-type first semiconductor layer 110, the light-emitting layer 120, the P-type second semiconductor layer 130, the P-type third semiconductor layer 140, and the P-type carbon-doped gallium arsenide epitaxial layer 150, to expose a portion of the dielectric layer 160. Then, a protective layer (such as, silicon oxide protective layer, not shown in the figures) will be formed on the surface of the dielectric layer 160 and the roughened surface of the first semiconductor layer 110 and finally form cutting paths on the substrate. In the preferred embodiment of the present invention, after the MESA process, the total area of the distributed point-like transparent conductive electrodes 170 in the light-emitting diode of the present invention is approximately 3.5%~8% of the area of the epitaxial composite layer after the MESA process.

Figure 9:
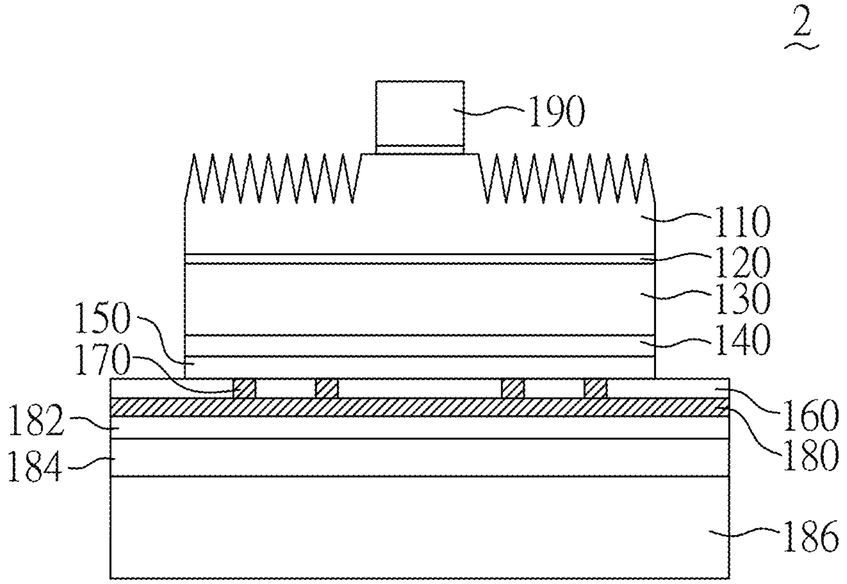
Figure 10:
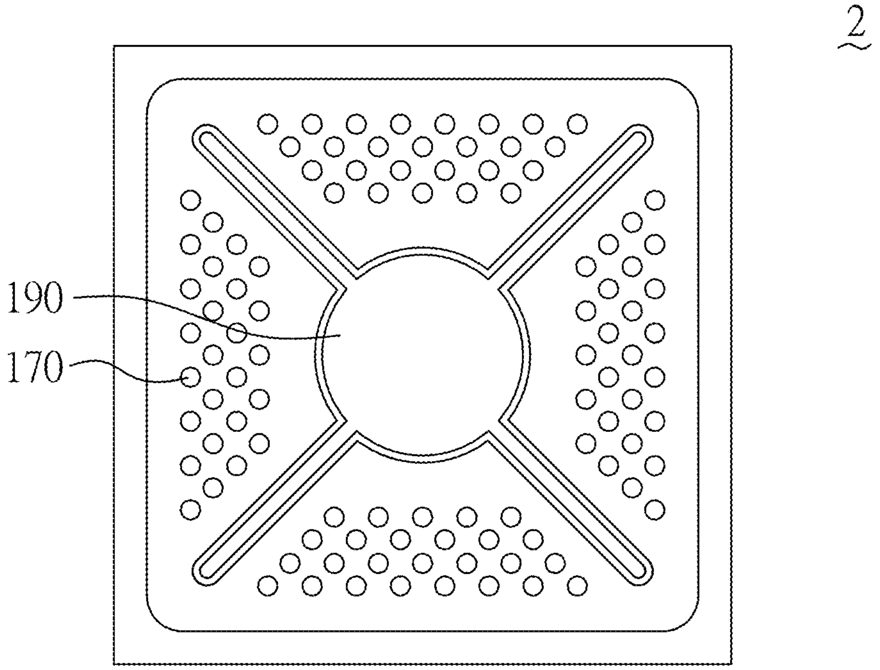
FIG. 10 is a top view of the light-emitting diode structure in one embodiment of the present invention.

Please refer to FIG. 9. A patterned N-type upper electrode 190 is formed on the planar region of the first semiconductor layer 110 to create the final structure of the light-emitting diode 2 of the present invention. The material of the upper electrode 190 can be germanium gold (GeAu), germanium gold nickel (GeAuNi), or the combination thereof. In particular, the upper electrode 190 does not overlap in vertical position with multiple lower point-like transparent conductive electrodes 170. Please refer to FIG. 10, which is a top view of the light-emitting diode 2 of the present invention in FIG. 9. It shows the non-overlapping configuration of the upper electrode 190 and the lower point-like transparent conductive electrodes 170 in their vertical distribution. In this way, the design of the upper and lower electrodes not only achieves the purpose of current spreading but also prevents the light emitted from the light-emitting layer from being blocked by the upper electrode 190. Thereby, light extraction efficiency will be enhanced.

In summary, the disclosed short-wavelength infrared light-emitting diode structure of the present invention has at least the following advantages: (1) The lattice of the P-type carbon-doped gallium arsenide epitaxial layer 150 matches with the upper aluminum indium phosphide epitaxial layer 140. Therefore, the P-type carbon-doped gallium arsenide epitaxial layer 150 of the present invention does not require to utilize a transition layer in the structure of the light-emitting diode as mentioned in the background so the three-layer structure of the known structure, which includes a transition layer, P-type magnesium-doped gallium phosphide epitaxial layer, and P-type carbon-doped gallium phosphide epitaxial layer can be replaced directly. In this way, the epitaxial structure of the light-emitting diode and its manufacturing process will be simplified, and thus, production costs will be decreased. (2) The P-type carbon-doped gallium arsenide epitaxial layer 150 in the light-emitting diode of the present invention does not exhibit known absorption issues within the emission wavelength range of 1000-1200 nanometers (nm) of the carbon-doped gallium phosphide epitaxial layer. Therefore, the light-emitting diode of the present invention can effectively enhance the overall brightness compared to conventional structures. (3) Compared with the conventional carbon-doped gallium phosphide epitaxial layers, the material of the P-type carbon-doped gallium arsenide epitaxial layer 150 also contributes to reducing the forward voltage.

The above embodiments are provided for illustrative purposes and to explain the technical features of the present invention, and are not intended to limit the scope of protection of the present invention. Any modifications or equivalents that can be easily made by those skilled in the art are within the scope claimed by the present invention, and the scope of protection of the present invention shall be determined by the scope of the patent application.

What is claimed is:

1. A light-emitting diode, comprising:

multiple point-like transparent conductive electrodes, a dielectric layer disposed around each of the point-like transparent conductive electrodes; and an epitaxial composite layer comprising a carbon-doped gallium arsenide epitaxial layer, disposed both on each of the point-like transparent conductive electrodes and the dielectric layer, and electrically connected to each of the point-like transparent conductive electrodes.

2. The light-emitting diode of claim 1, wherein the materials of the point-like transparent conductive electrodes comprise indium tin oxide.

3. The light-emitting diode of claim 1, wherein the ratio of the total distribution area of the point-like transparent conductive electrodes to the area of the epitaxial composite layer is 3.5% to 8%.

4. The light-emitting diode of claim 1, wherein the thickness of the carbon-doped gallium arsenide epitaxial layer is 100 to 1000 angstroms (Å).

5. The light-emitting diode of claim 1, wherein the carbon-doping concentration of the carbon-doped gallium arsenide epitaxial layer is 4.0*E19 to 1.5*E20.

6. The light-emitting diode of claim 1, wherein the epitaxial composite layer further comprises a first semiconductor layer, a light-emitting layer, a second semiconductor layer and a third semiconductor layer, and wherein the third semiconductor layer is disposed on the carbon-doped gallium arsenide epitaxial layer, the second semiconductor layer is disposed on the third semiconductor, the light-emitting layer is disposed on the second semiconductor layer, and the first semiconductor layer is disposed on the light-emitting layer.

7. The light-emitting diode of claim 6, wherein the first semiconductor layer is an N-type aluminum gallium arsenide (AlGaAs) epitaxial layer, and the second semiconductor layer is a P-type aluminum gallium arsenide (AlGaAs) epitaxial layer, and the third semiconductor layer is a P-type aluminum indium phosphide (AlInP) epitaxial layer.

8. The light-emitting diode of claim 1, further comprising an upper electrode disposed on the epitaxial composite layer and not vertically overlapping with the point-like transparent conductive electrodes.

9. A light-emitting diode, comprising:

multiple point-like transparent conductive electrodes;

a dielectric layer disposed around each of the point-like transparent conductive electrodes;

an epitaxial composite layer comprising a carbon-doped gallium arsenide epitaxial layer, disposed both on each of the point-like transparent conductive electrodes and the dielectric layer, and electrically connected to each of the point-like transparent conductive electrodes; and a first transparent conductive layer, a second transparent conductive layer and a metal layer, wherein the first transparent conductive layer is disposed on the second transparent conductive layer and electrically connected to the point-like transparent conductive electrodes, and the second transparent conductive layer is disposed on the metal layer.

10. The light-emitting diode of claim 9, wherein the materials of the first transparent conductive layer comprise indium tin oxide.

11. The light-emitting diode of claim 9, wherein the second transparent conductive layer is made of indium tin oxide, zinc aluminum oxide, zinc tin oxide, nickel oxide, cadmium tin oxide, antimony tin oxide and the combination thereof.

* * * * *